United States Patent
Ichikawa et al.

(10) Patent No.: US 6,242,797 B1
(45) Date of Patent: *Jun. 5, 2001

(54) SEMICONDUCTOR DEVICE HAVING PELLET MOUNTED ON RADIATING PLATE THEREOF

(75) Inventors: Seiji Ichikawa; Takeshi Umemoto; Toshiaki Nishibe; Kazunari Sato; Kunihiko Tsubota; Masato Suga; Yoshikazu Nishimura; Keita Okahira; Tatsuya Miya; Toru Kitakoga; Kazuhiro Tahara, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/059,324

(22) Filed: Apr. 13, 1998

(30) Foreign Application Priority Data

May 19, 1997 (JP) .................................................. 9-128758

(51) Int. Cl.[7] .......................... H01L 23/48; H01L 23/28; H01L 23/495; H05K 7/20

(52) U.S. Cl. .......................... 257/666; 257/684; 257/796; 257/675; 257/696; 257/692; 257/693; 257/698; 257/712; 257/676; 257/706; 361/388; 361/704; 361/712; 174/52.4; 438/123

(58) Field of Search ....................... 257/666, 675, 257/692, 693, 696, 698, 712, 713, 717, 720, 796, 784, 676, 706; 361/388, 712, 705, 704; 174/52.4; 438/123

(56) References Cited

U.S. PATENT DOCUMENTS

| | | | |
|---|---|---|---|
| 4,392,151 | * 7/1983 | Iwatani ................................. | 257/692 |
| 5,157,478 | * 10/1992 | Ueda et al. ........................... | 257/796 |
| 5,225,897 | * 7/1993 | Reifel et al. ......................... | 257/787 |
| 5,229,918 | * 7/1993 | Bosca et al. ......................... | 361/710 |
| 5,281,849 | * 1/1994 | Sing Deo et al. ................... | 257/693 |
| 5,289,344 | * 2/1994 | Gagnon et al. ...................... | 361/712 |
| 5,296,740 | * 3/1994 | Sono et al. ........................... | 257/706 |
| 5,446,959 | 9/1995 | Kim et al. . | |
| 5,583,371 | * 12/1996 | Hori ..................................... | 257/675 |
| 5,614,735 | * 3/1997 | Kitamura et al. ................... | 257/99 |
| 5,656,864 | * 8/1997 | Mitsue et al. ........................ | 257/787 |
| 5,834,842 | * 11/1998 | Majumdar et al. .................. | 257/718 |
| 5,917,704 | * 6/1999 | Trublowski et al. ................ | 361/705 |
| 5,929,517 | * 7/1999 | Distefano et al. ................... | 257/684 |
| 5,939,781 | * 8/1999 | Lacap ................................... | 257/698 |

FOREIGN PATENT DOCUMENTS

| | | | |
|---|---|---|---|
| 6-34794 | 1/1995 | (EP) | ............................ H01L/23/373 |
| 59-43534 | * 3/1984 | (JP) | ................................. 257/796 |
| 60-257159 | * 12/1985 | (JP) | ................................. 257/796 |
| 61-216454 | 9/1986 | (JP) | .............................. H01L/23/48 |
| 60-238839 | 5/1987 | (JP) | .............................. H01L/23/38 |
| 4326556 | 11/1992 | (JP) | .............................. H01L/23/29 |
| 05226532A | * 9/1993 | (JP) | ................................. 257/666 |
| 6209054 | 7/1994 | (JP) | .............................. H01L/23/28 |
| 6224326 | 8/1994 | (JP) | .............................. H01L/23/28 |
| 5-057542 | 9/1994 | (JP) | .............................. H01L/23/50 |
| 6-275759 | 9/1994 | (JP) | .............................. H01L/23/50 |
| 8181266 | 7/1996 | (JP) | .............................. H01L/23/50 |

\* cited by examiner

Primary Examiner—Alexander O. Williams
(74) Attorney, Agent, or Firm—Hayes, Soloway, Hennessey, Gossman & Hage, P.C.

(57) ABSTRACT

A semiconductor device having a pellet mounted on a radiating plate thereof is disclosed. The radiating plate is formed in such a shape that a central portion thereof is positioned higher than both end portions thereof. A pellet is mounted on a lower face of the central portion of the radiating plate, and an upper face of the central portion of the radiating plate is exposed to the top of a resin member. Since the upper face of the central portion of the radiating plate which has the pellet mounted on the lower face thereof is exposed from the resin member, heat generated by the pellet can be radiated efficiently.

10 Claims, 5 Drawing Sheets

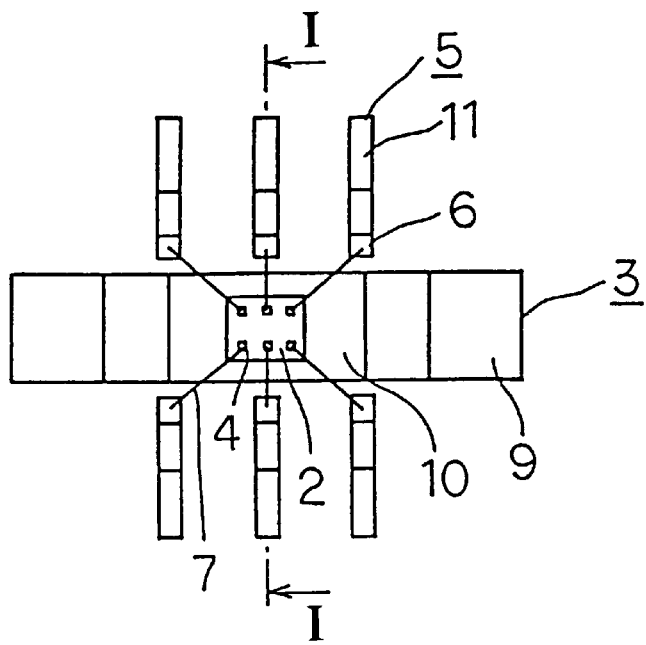
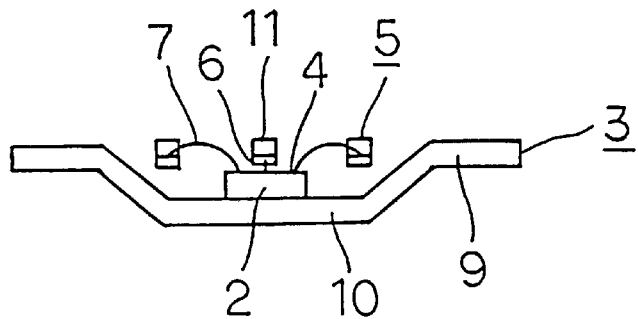
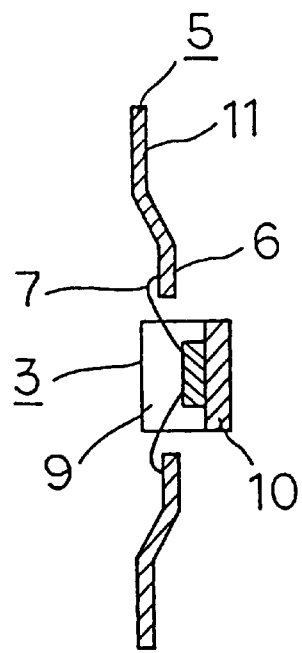

SEMICONDUCTOR DEVICE HAVING PELLET MOUNTED ON RADIATING PLATE THEREOF

BACKGROUND OF THE INVENTION

1. Field of the Invention

This invention relates to a semiconductor device, and more particularly to a semiconductor device having a pellet mounted on a radiating plate thereof and a method of manufacturing the semiconductor device.

2. Description of the Related Art

Conventionally, semiconductor devices such as an LSI (Large Scale Integrated Circuit) and a transistor chip are utilized in various electronic apparatus. In such apparatus as just mentioned, generally a pellet including a semiconductor circuit is encapsulated in a resin member, and a large number of lead terminals each formed from an elongated conductive plate are provided on the opposite sides of the resin member.

Since those lead terminals are connected to connection pads of the pellet in the inside of the resin member, if the semiconductor device is mounted on a circuit board and the lead terminals are connected to signal lines, then various signals can be inputted to and outputted from the pellet.

However, such a semiconductor device as described above inevitably generates heat when the pellet inputs/outputs a signal. For example, in a semiconductor device used for transmission of radiowaves of a portable telephone set, since it consumes a large amount of power, the pellet generates a large amount of heat. Therefore, it is required to radiate the heat efficiently.

In a semiconductor device disclosed, for example, in Japanese Patent Laid-open No. 209054/94, the radiating plate is exposed at a central portion thereof to the bottom of the resin member so that heat generated by the pellet may be radiated from the central portion of the radiating plate.

However, since the central portion of the radiating plate cannot be connected to a conductor pattern of the circuit board by solder, the effect of heat radiation at this position cannot be anticipated.

On the other hand, in another semiconductor device which is disclosed in Japanese Patent Laid-open No. 224326/94, the radiating plate is exposed at a central portion thereof to the bottom of the resin member and is exposed at four corner portions thereof to the top of the resin member so that heat generated by the pellet may be radiated from the central portion and the four corner portions of the radiating plate.

However, the four corner portions of the radiating plate exposed to the top of the resin member cannot be connected to conductor patterns of the circuit board by solder and cannot contribute very much to heat radiation.

Meanwhile, in a further semiconductor device which is disclosed in Japanese Patent Laid-open No. 63142/90, the radiating plate is exposed not only at a central portion thereof but also at an end portion thereof to the bottom of the resin member so that heat generated by the pellet may be radiated from the central portion and the end portion of the radiating plate.

However, while the end portion of the radiating plate exposed to the bottom of the resin member contributes to heat radiation since it can be connected to a conductor pattern of the circuit board by solder, this is not sufficient to achieve sufficient radiation of heat generated by the pellet.

SUMMARY OF THE INVENTION

It is an object of the present invention to provide a semiconductor device which can efficiently radiate heat generated by a pellet.

In a conventional semiconductor device to which the present invention is applied, a pellet including a semiconductor circuit having a plurality of connection pads provided thereon is mounted on a radiating plate, and a plurality of lead terminals each formed from an elongated conductive plate are disposed on the outer sides of the pellet. The lead terminals and connection pads of the pellet are individually connected to each other by bonding wires, and at least part of the radiating plate, the pellet, the bonding wires and inner portions of the lead terminals are encapsulated in the inside of a resin member.

In the present invention of the semiconductor device having such a construction as described above, the radiating plate is formed in such a shape that a central portion thereof is positioned higher than both end portions thereof, and an upper face of the central portion of the radiating plate is exposed to the top of the resin member while the pellet is mounted on a lower face of the central portion of the radiating plate.

Accordingly, since the central portion of the radiating plate which is positioned higher than both end portions is exposed to the top of the resin member and the pellet is mounted on the lower face of the central portion of the radiating plate whose upper face is exposed from the resin member in this manner, heat generated by the pellet can be radiated efficiently from the central portion of the radiating plate.

It is to be noted that, in the present invention, the direction in which the semiconductor device is mounted on a circuit board is referred to as upper direction and a direction perpendicular to the direction is referred to as sideward direction. However, such directions are used conveniently in order to simplify description and do not restrict any direction when the device is manufactured or actually used.

Further, the radiating plate in the present invention signifies a member on which a pellet is mounted and which contributes to radiation of heat from the pellet, and allows, for example, an island made of a metal.

In the semiconductor device of the present invention, both end portions of the radiating plate may be exposed to lower faces of both end portions of the resin member.

Accordingly, both end portions of the radiating plate can be connected directly to conductor patterns of a circuit board by solder. In this instance, since heat generated by the pellet can be radiated not only from the central portion of the radiating plate but also from both end portions of the radiating plate, the heat radiation property can be further improved efficiently. Further, soldering to the circuit board can be performed with certainty, and a dispersion in thermal resistance which arises from non-uniform soldering can be decreased.

In the semiconductor device of the present invention, the bonding wires may connect the connection pads on a lower face of the pellet and lower faces of the inner portions of the lead terminals to each other.

Accordingly, although the pellet is disposed in a vertically inverted condition to that in a conventional arrangement, the connection pads are connected from the same direction as the lead terminals. In particular, the connection pads positioned on the lower face of the pellet can be connected readily from the same direction to the lead terminals by the bonding wires.

In the semiconductor device of the present invention, the lead terminals may be formed in such a shape that outer portions thereof are positioned flush with the lower face of the resin member and the inner portions thereof are positioned higher than the outer portions.

Accordingly, since the lower faces of the inner portions of the lead terminals to which the bonding wires are connected are positioned higher than the bottom of the resin member, the bonding wires connecting to the lower faces of the inner portions of the lead terminals are not exposed from the bottom of the resin member at all.

In the semiconductor device of the present invention, a heat sink may be provided on the upper face of the central portion of the radiating plate which is exposed from the resin member.

Accordingly, although the central portion of the radiating plate exposed to the top of the resin member cannot be connected to a conductor pattern of a circuit board, it contributes to radiation of heat efficiently through the heat sink. Consequently, the heat radiating property of the central portion of the radiating plate can be improved by the heat sink.

In a conventional method of manufacturing a semiconductor device to which the present invention is applied, a single lead frame wherein a plurality of lead terminals and a single radiating plate are connected integrally to each other by tie bars and/or a runner is formed. A pellet including a semiconductor circuit having a plurality of connection pads provided thereon is mounted onto a portion of the radiating plate of the lead frame, and the plurality of connection pads of the pellet and the plurality of lead terminals of the lead frame are individually connected to each other by a plurality of bonding wires.

The lead frame on which the pellet and the bonding wires are integrally mounted is placed into a cavity of at least a pair of mutually removable metal molds such that outer portions of the lead terminals are held by and between the metal molds, and molten resin is filled into the cavity of the metal molds.

As the filled resin is left until the resin is solidified, a resin member in which at least part of the radiating plate, the pellet, the bonding wires and the inner portions of the lead terminals are encapsulated and from which the outer portions of the lead terminals are exposed outwardly is formed. The tie bars and/or the runner of the lead frame are cut away to individually separate the radiating plate and the plurality of lead terminals from each other.

According to the present invention of such a method of manufacturing a semiconductor device as described above, when the lead frame is to be formed, the radiating plate is formed in such a shape that a central portion thereof is positioned higher than both end portions thereof and the lead terminals are formed in such a shape that inner portions thereof are positioned higher than outer portions thereof.

When the pellet is to be mounted onto the lead frame, it is mounted onto a lower face of the portion of the radiating plate in such a condition that the connection pads are positioned downwardly. When the pellet and the lead terminals are to be connected by the bonding wires, the connection pads on the lower face of the pellet and lower faces of the inner portions of the lead terminals are individually connected to each other.

When the lead frame is placed into the inside of the metal molds, both end portions of the radiating plate and the outer portions of the lead terminals are held by and between the pair of metal molds and an upper face of the central portion of the radiating plate is contacted with an inner face of the metal molds.

Accordingly, in a semiconductor device manufactured by such a method of the present invention as described above, the central portion of the radiating plate which is positioned higher than both end portions is exposed to the top of the resin member. Since the pellet is mounted on the lower face of the central portion of the radiating plate whose upper face is exposed from the resin member in this manner, heat generated by the pellet can be radiated efficiently from the central portion of the radiating plate.

In short, with the production method of the present invention, a semiconductor device of a structure wherein an upper face of a central portion of a radiating plate on a lower face of which a pellet is mounted is exposed from a resin member can be realized readily. Further, since a radiating plate and a plurality of lead terminals are formed simultaneously from a single lead frame, the productivity is higher than that of an alternative production method wherein the radiating plate and the lead terminals are formed separately from each other.

The above and other objects, features and advantages of the present invention will become apparent from the following description with reference to the accompanying drawings which illustrate examples of the present invention.

BRIEF DESCRIPTION OF THE DRAWINGS

FIG. 5a is a plan view showing lead terminals connected to the pellet by bonding wires;

FIG. 5b is a side elevational view showing the lead terminals connected to the pellet by the bonding wires;

FIG. 5c is a vertical sectional front elevational view taken along line I—I of FIG. 5a;

DETAILED DESCRIPTION OF THE PREFERRED EMBODIMENTS

Figure 1A:
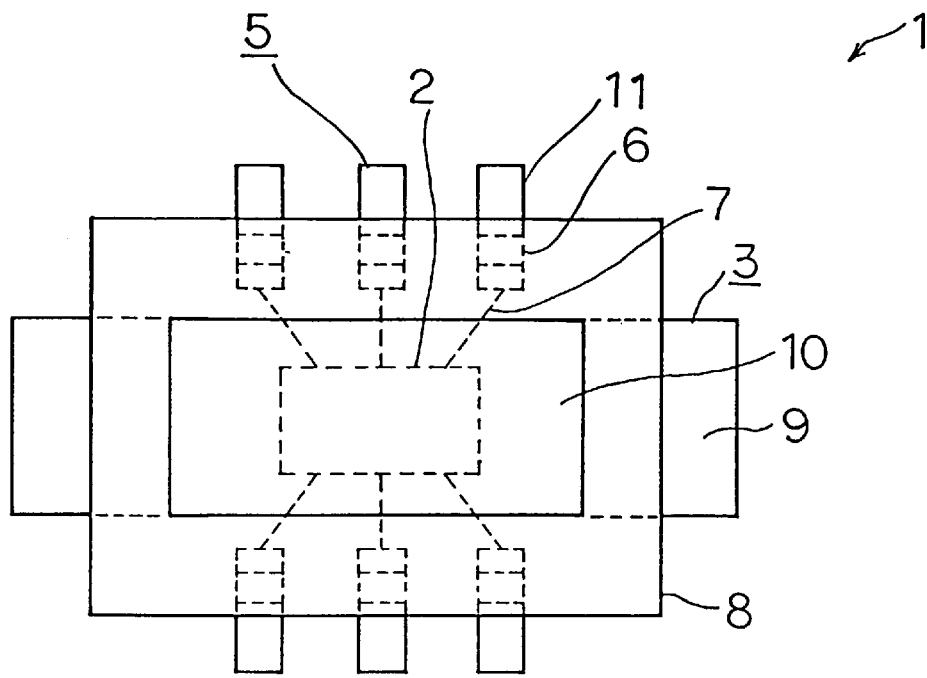
FIG. 1a is a plan view showing an appearance of a semiconductor device.
Figure 1B:
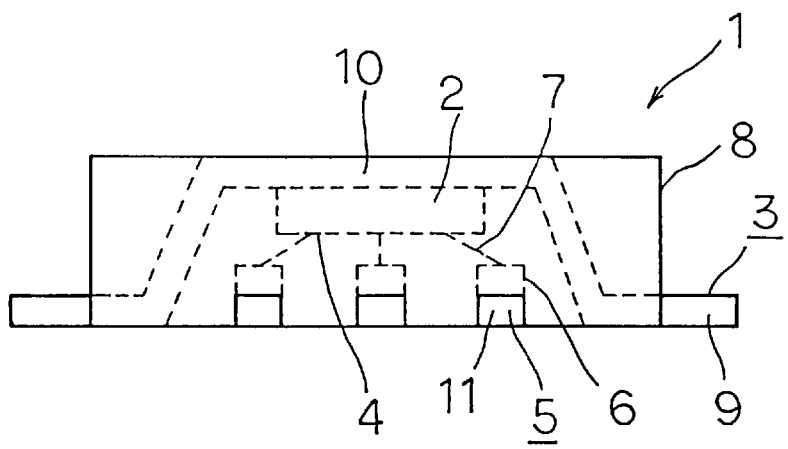
FIG. 1b is a side elevational view showing another appearance of the semiconductor device.
Figure 1C:
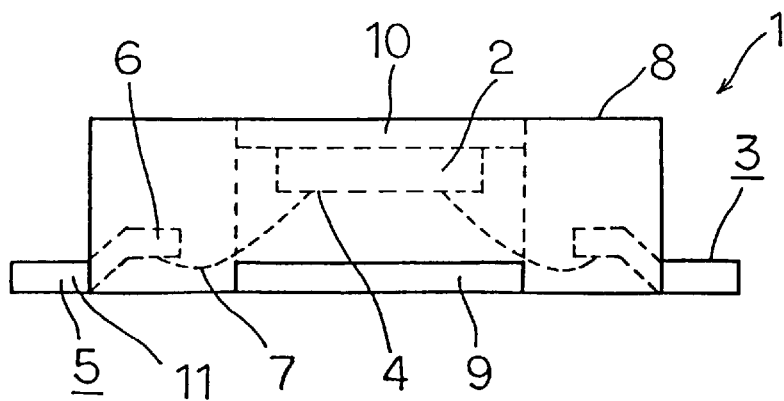
FIG. 1c is a front elevational view showing a further appearance of the semiconductor device.

Integrated circuit device 1 of an embodiment of the present invention includes pellet 2 of an integrated circuit formed from a semiconductor circuit as shown in FIGS. 1a to 1c. This pellet 2 is mounted on radiating plate 3 in the form of an island made of a metal.

Pellet 2 includes a large number of connection pads 4. Radiating plate 3 has a large number of lead terminals 5 arranged on the opposite sides thereof.

The large number of connection pads 4 of pellet 2 and inner portions 6 of the large number of lead terminals 5 are individually connected to each other by a large number of bonding wires 7. Pellet 2, part of radiating plate 3, bonding wires 7 and inner portions 6 of lead terminals 5 are encapsulated in the inside of resin member 8.

However, in integrated circuit device 1 of the present embodiment, radiating plate 3 is formed in a shape of an arch wherein both end portions 9 thereof are positioned higher than central portion 10 thereof. An upper face of central portion 10 of radiating plate 3 is exposed to the top of resin member 8, and both end portions 9 are exposed to the outside from the bottom of both end portions of resin member 8.

Pellet 2 is disposed such that also connection pads 4 are positioned on a lower face thereof. Pellet 2 is carried on a lower face of central portion 10 of radiating plate 3.

Lead terminals 5 are formed each in a shape of a crank. While outer portions 11 of lead terminals 5 which extend outwardly from resin member 8 are positioned flush with the bottom face of resin member 8, inner portions 6 are positioned higher than outer portions 11. Also bonding wires 7 connect connection pads 4 on the lower face of pellet 2 and the lower faces of inner portions 6 of lead terminals 5 to each other.

Integrated circuit device 1 of the present embodiment having the construction described above is mounted on an upper face of a circuit board (not shown)

In this instance, outer portions 11 of the large number of lead terminals 5 which extend outwardly from the side faces of resin member 8 are individually connected to a large number of signal lines of the circuit board by solder. Both end portions 9 of radiating plate 3 which extend outwardly from the front face and the rear face of resin member 8 are connected to conductor patterns such as grounding lines of the circuit board by solder.

Figure 2:
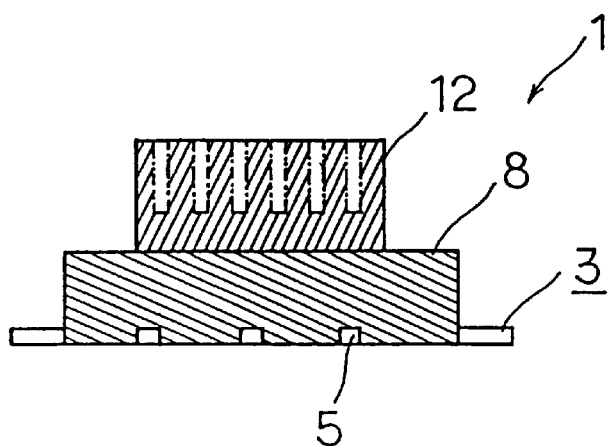
FIG. 2 is a side elevational view showing the semiconductor device on which a heat sink is mounted.

Further, as shown in FIG. 2, heat sink 12 formed as a separate member is adhered to central portion 10 of radiating plate 3, which is exposed to the top of resin member 8, by a heat conducting bonding agent such as silver paste or gold tin.

It is to be noted that it is otherwise possible to adhere central portion 10 of radiating plate 3 of integrated circuit device 1 to a central portion of another radiating plate (not shown) of a size larger than resin member 8 and secure the radiating plate at both end portions thereof to a circuit board by means of screws.

In such a condition as described above, integrated circuit device 1 of the present embodiment can execute various signal processes since pellet 2 can input and/or output various signals to and/or from signal lines of the circuit board through lead terminals 5.

Although pellet 2 which operates in this manner inevitably generates heat, this heat is radiated efficiently by radiating plate 3.

In particular, both end portions 9 of radiating plate 3 having pellet 2 mounted at central portion 10 thereof are exposed to the lower face of resin member 8. Since both end portions 9 are connected directly to conductor patterns of the circuit board by solder, heat generated by pellet 2 can be radiated efficiently from both end portions 9 of radiating plate 3.

Besides, central portion 10 of radiating plate 3 on which pellet 2 is carried is exposed to the top of resin member 8. Since heat sink 12 is mounted on this central portion 10, heat generated by pellet 2 can be radiated efficiently also from central portion 10 of radiating plate 3.

It is to be noted that, while pellet 2 is disposed in a vertically inverted condition in order to realize such heat radiation from central portion 10 of radiating plate 3 as described above, since bonding wires 7 connect connection pads 4 on the lower face of pellet 2 and the lower faces of inner portions 6 of lead terminals 5 to each other, this connection is easy.

Besides, since inner portions 6 of lead terminals 5 to which bonding wires 7 are connected are positioned higher than outer portions 11 as described above, bonding wires 7 are not exposed from resin member 8. Further, since outer portions 11 of inner portions 6 are positioned flush with the lower face of resin member 8, integrated circuit device 1 allows plane mounting.

Here, an outline of a method of manufacturing integrated circuit device 1 of the present embodiment is described with reference to FIGS. 3a to 6b.

It is to be noted that, in order to facilitate description of the production method, in FIGS. 3a to 6b, the parts are shown in a vertically inverted condition to those of FIGS. 1a to 1c and 2.

First, a lead frame including a large number of lead terminals 5 and a single radiating plate 3 which are integrally connected to each other by tie bars is formed by etching of a very thin metal plate.

Figure 3A:
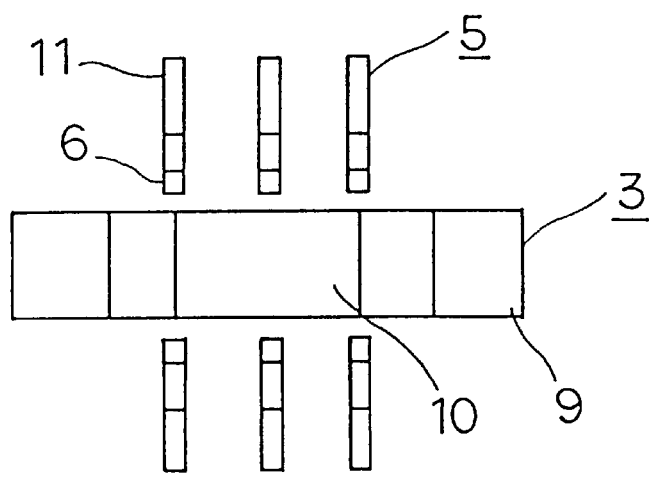
FIG. 3a is a plan view showing essential part of a lead frame.
Figure 3B:
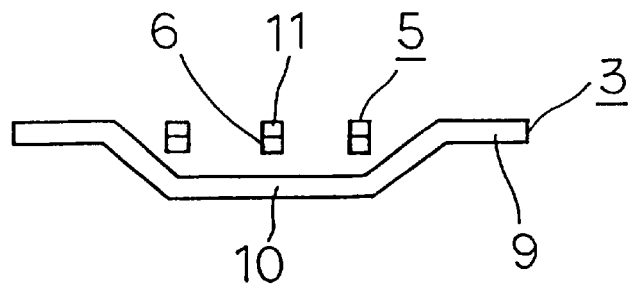
FIG. 3b is a side elevational view showing essential part of the lead frame.

Then, this lead frame is deformed by a press machine to shape radiating plate 3 so as to have a shape of an arch as seen in FIG. 3b wherein central portion 10 is positioned higher than both end portions 9 and to shape lead terminals 5 each into a crank shape so that inner portions 6 may be positioned higher than outer portions 11 thereof.

It is to be noted that, since the parts are shown in a vertical inverted condition in FIGS. 3a to 6b as described hereinabove, in those figures, central portion 10 of radiating plate 3 is positioned lower than both end portions 9 and inner portions 6 of lead terminals 5 are positioned lower than outer portions 11.

Figure 4A:
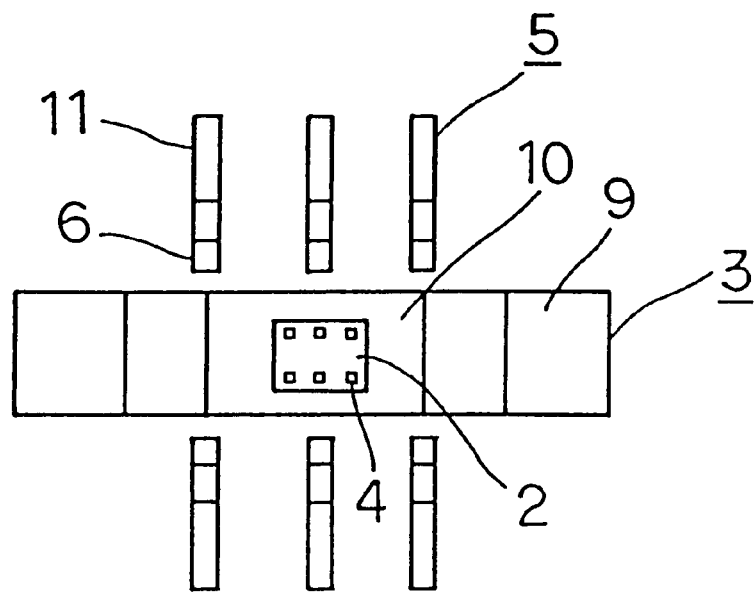
FIG. 4a is a plan view showing the lead frame on which a pellet is mounted.
Figure 4B:
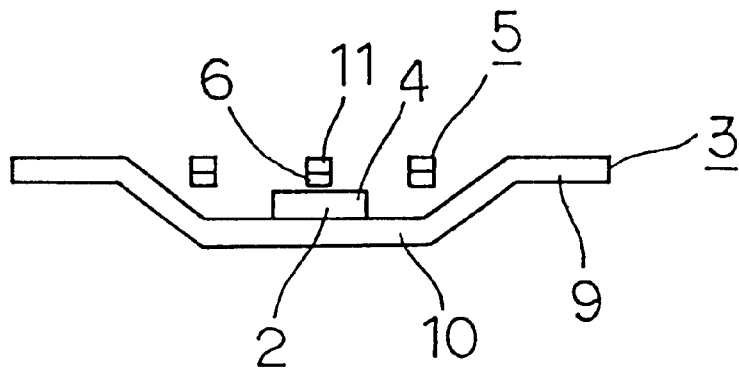
FIG. 4b is a side elevational view showing the lead frame on which the pellet is mounted.

Thereafter, pellet 2 is mounted onto the lower face of central portion 10 of radiating plate 3 with connection pads 4 thereof positioned downwardly as seen in FIG. 4, and connection pads 4 on the lower face of pellet 2 and the lower faces of inner portions 6 of lead terminals 5 are connected to each other by bonding wires 7 as shown in FIGS. 5a to 5c.

The lead frame on which pellet 2 and inner portions 6 are mounted integrally in this manner is placed into a cavity of a pair of mutually removable metal molds.

In this instance, the lead frame is placed such that outer portions 11 of lead terminals 5 and both end portions 9 of radiating plate 3 are held by and between the pair of metal molds and the upper face of central portion 10 of radiating plate 3 is contacted with the inner face of the metal molds so that those portions may be exposed from resin member 8.

Then, molten resin is filled into the cavity of the metal molds in such a condition as described above and then left so that it is solidified. Consequently, resin member 8 in the inside of which pellet 2, part of radiating plate 3, bonding wires 7 and inner portions 6 of lead terminals 5 are encapsulated is formed.

Figure 6A:
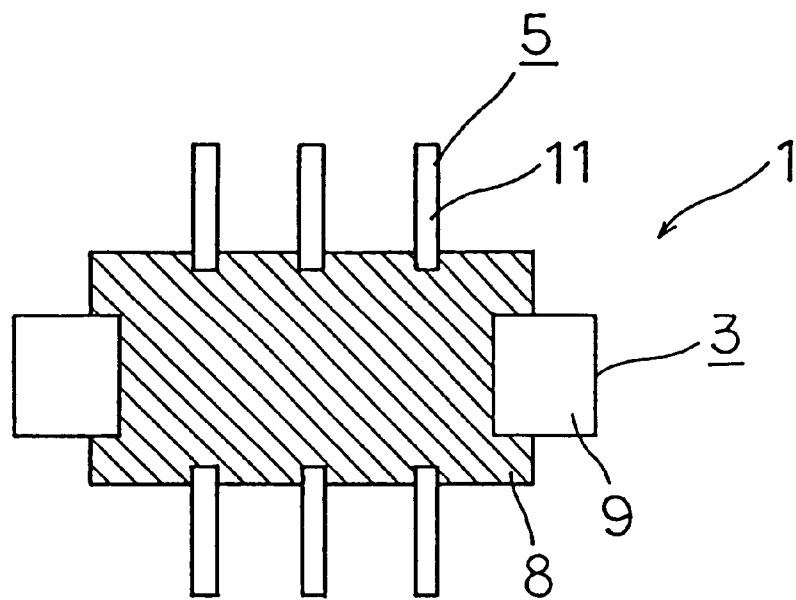
FIG. 6a is a plan view showing a resin member in a molded condition.
Figure 6B:
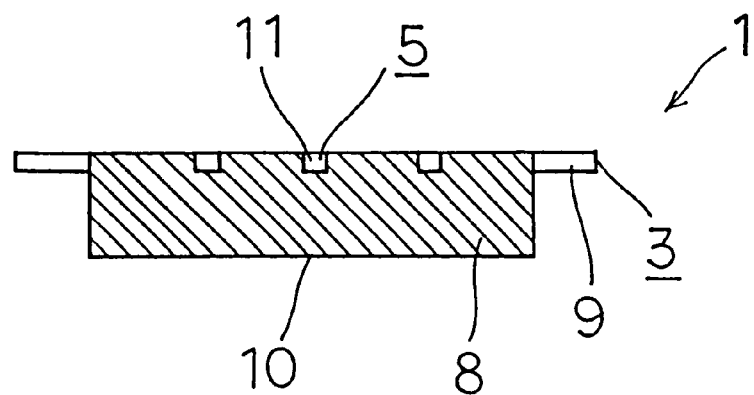
FIG. 6b is a side elevational view showing the resin member in the molded condition.

Thereafter, burrs of the resin are removed and the tie bars of the lead frame are cut away, thereby completing integrated circuit device 1 as seen in FIGS. 6a and 6b.

By manufacturing integrated circuit device 1 in such a manner as described above, the structure wherein outer portions 11 of lead terminals 5 and both end portions 9 of radiating plate 3 project outwardly to positions on the lower face of resin member 8 and the upper face of central portion 10 of radiating plate 3 is exposed to the top of resin member 8 can be realized simply.

It is to be noted that it is demonstrated in the embodiment described above that heat sink 12 is mounted on central portion 10 of radiating plate 3 which is exposed from resin member 8 to improve the effect of heat radiation However, it is otherwise possible, for example, to cause central portion 10 of radiating plate 3 to radiate heat directly from the surface thereof without making use of such heat sink 12 as described above.

While preferred embodiments of the present invention have been described using specific terms, such description is for illustrative purpose only, and it is to be understood that changes and variations may be made without departing from the spirit or scope of the following claims.

What is claimed is:

1. A semiconductor device, comprising:
   a pellet including a semiconductor circuit having a plurality of connection pads provided thereon;
   a plurality of lead terminals each having a first end and a second end and each comprising an elongated conductive plate;
   a radiating plate formed from a single sheet of metal in such a shape that a central portion thereof is positioned higher than both end portions thereof and having said pellet mounted on a lower face of said central portion thereof;
   a plurality of bonding wires for individually connecting one of said first ends of said plurality of lead terminals and one of said plurality of connection pads of said pellet to each other; and
   a resin member for encapsulating said pellet, said bonding wires, inner portions of said lead terminals and said first ends of said lead terminals therein such that said second ends of said lead terminals remain exposed and encapsulating said radiating plate such that an upper face of said central portion thereof is exposed on the top surface of said resin member, and both end portions of said radiating plate are exposed to lower faces of both end portions of said resin member and extend outwardly beyond and flush with the lower faces of said resin member;
   wherein each of said second ends of said lead terminals and both end portions of said radiating plate are flush with the bottom surface of said semiconductor device.

2. A semiconductor device as claimed in claim 1, wherein said bonding wires connect said connection pads on a lower face of said pellet and lower faces of said inner portions of said lead terminals to each other.

3. A semiconductor device as claimed in claim 2, wherein said lead terminals are formed in such a shape that outer portions thereof are positioned flush with the lower face of said resin member and the inner portions thereof are positioned higher than the outer portions.

4. A semiconductor device as claimed in claim 2, wherein said lead terminals are formed in such a shape that outer portions thereof are positioned flush with the lower face of said resin member and the inner portions thereof are positioned higher than the outer portions.

5. A semiconductor device as claimed in claim 1, wherein a heat sink is provided on the upper face of said central portion of said radiating plate which is exposed from said resin member.

6. A semiconductor device as claimed in claim 2, wherein a heat sink is provided on the upper face of said central portion of said radiating plate which is exposed from said resin member.

7. A semiconductor device as claimed in claim 2, wherein a heat sink is provided on the upper face of said central portion of said radiating plate which is exposed from said resin member.

8. A semiconductor device as claimed in claim 3, wherein a heat sink is provided on the upper face of said central portion of said radiating plate which is exposed from said resin member.

9. A semiconductor device as claimed in claim 4, wherein a heat sink is provided on the upper face of said central portion of said radiating plate which is exposed from said resin member.

10. A method of manufacturing a semiconductor device as claimed in claim 1, comprising the steps of:
    forming a lead frame wherein a radiating plate having such a shape that a central portion thereof is positioned higher than both end portions thereof and a plurality of lead terminals having such a shape that inner portions thereof are positioned higher than outer portions thereof are connected integrally to each other by support elements;
    mounting a pellet including a semiconductor circuit having a plurality of connection pads provided thereon onto a lower face of a portion of the radiating plate of the lead frame in such a condition that the connection pads are positioned downwardly;
    connecting the plurality of connection pads of the pellet mounted on the lead frame and lower faces of the inner portions of the plurality of lead terminals individually to each other by a plurality of bonding wires;
    placing at least the pellet and the bonding wires into a cavity of at least one pair of mutually removable metal molds such that both end portions of the radiating plate of the lead frame and the outer portions of the lead terminals are held by and between said metal molds and an upper face of the central portion of the radiating plate is contacted with an inner face of said metal molds;
    filling molten resin into the cavity of said metal molds;
    leaving the filled resin in the cavity of said metal molds until the resin is solidified to form a resin member in which at least part of the radiating plate, the pellet, the bonding wires and the inner portions of the lead terminals are encapsulated and from which the outer portions of the lead terminals are exposed outwardly; and
    cutting away the support elements of the lead frame to individually separate the radiating plate and the plurality of lead terminals from each other.

* * * * *